United States Patent [19]

Tomlinson

[11] Patent Number: 4,785,530
[45] Date of Patent: Nov. 22, 1988

[54] HAND TOOL FOR AIDING CLOSURE OF INTEGRATED CIRCUIT STORAGE CARTRIDGES

[75] Inventor: Herbert Tomlinson, Belleville, Canada

[73] Assignee: Northern Telecom Limited, Montreal, Canada

[21] Appl. No.: 75,178

[22] Filed: Jul. 20, 1987

[51] Int. Cl.$^4$ ............................................. B23P 19/00
[52] U.S. Cl. ........................................ 29/758; 81/44; 81/488
[58] Field of Search .................... 29/758; 81/44, 488; 206/328, 332, 334

[56] References Cited

U.S. PATENT DOCUMENTS

| | | | |
|---|---|---|---|
| 4,685,562 | 8/1987 | Swain | 206/328 |
| 4,690,274 | 9/1987 | Lue | 206/328 |
| 4,702,371 | 10/1987 | Hoshi et al. | 206/328 |

*Primary Examiner*—P. W. Echols
*Assistant Examiner*—Taylor J. Ross
*Attorney, Agent, or Firm*—J. E. Moorhouse

[57] ABSTRACT

A hand tool for assisting in the manual closure of integrated circuit (IC) storage and shipping cartridges, includes a base and a shank extending normal from one end of the base and terminating at a grip or stop formation. A pair of tines extends normal from another end of the base, along a direction of the shank. A hinged flap is mounted next to the second end such that it is rotatable to assume a position spaced parallel and extending along the tines. In use, the tines are inserted into an open end of a cartridge full of ICs, with the shank lying along the outer edge of the cartridge and thereafter pressure is manually applied via the tines against an IC to clear a pair of holes in the cartridge and permit insertion of a closure pin through the holes and between the tines. The flap is positioned against the pin to assist in driving the pin into an interference fit. After the pin is inserted the ICs are firmly retained in the cartridge in the well known and desired manner.

2 Claims, 2 Drawing Sheets

HAND TOOL FOR AIDING CLOSURE OF INTEGRATED CIRCUIT STORAGE CARTRIDGES

The invention is concerned with apparatus for containing integrated electronic circuits (ICs) for loading storage and shipping of such circuits. More particularly the invention relates to a hand tool for aiding in manual loading and unloading of ICs into and out of IC retaining tubes or cartridges.

BACKGROUND OF THE INVENTION

Inline packaged ICs are usually retained between elongated inner and outer channel surfaces of an IC shipping cartridge. The cartridge is closed at each end so that the ICs are contained. Removal of an end closure permits withdrawal of ICs from the cartridge one after the other, or permits insertion of ICs into the cartridge one after the other. One typical closure method is that of pinning the ends of the cartridge closed. At each end of the cartridge a closure pin is inserted through a pair of holes formed in the inner and outer channels so that, each pin extends across an end opening of the cartridge. Preferably, the holes are so placed that, when the cartridge is fully loaded, the ICs along with a resilient spacer occupy slightly more space than that available between the pairs of holes. Thus, to insert the second one of the pins, the ICs must become pressed against the first pin at the far end of the cartridge sufficiently to compress the spacer and remove the last IC from the space between the second pair of holes. When the second pin is inserted in the second pair of holes the ICs are tightly retained between the pins by the resilient spacer. It is typical that the pin includes an elongated body or shaft terminated at one end by a head portion and terminated at the other end by a flexible tip formation of greater cross-section than the body or shaft of the pin. The pin is inserted by first pressing the tip through the hole in the outer channel and secondly through the aligned hole in the inner channel, all the while maintaining the ICs and the spacer under pressure until the head of the pin is firmly seated against the outer channel. At first this operation may require a few attempts by a person before it is mastered. This is because of the manual dexterity required to simultaneously maintain sufficient pressure against the ICs while applying sufficient force to seat the pin home. Of course a manufacturer of ICs will typically employ a fully automated machine process to fill and thereafter pin cartridges closed in preparation for shipping to any of a multitude of circuit board assemblers or IC vendors.

Cartridges of ICs are received, for example, at the manufacturing facility of an assembler. An assembler may use the ICs directly for insertion via automatic insertion equipment, or the assembler may first subject each individual IC to a test routine, to determine the operational quality and apparent serviceability of each IC, before committing it to a circuit board assembly or the like. If the latter practice is followed, the ICs must be unloaded from the cartridge before testing, and thereafter, those ICs found to be acceptable are reloaded, and the cartridge is re-closed prior to delivery to the appropriate automatic insertion machine. Unless the assembler is accustomed to using tremendously high volumes of the ICs there is little or no economy in acquiring an automatic cartridge loading and closing machine similar to that employed by the IC manufacturer. Consequently, these functions are usually performed manually. Over the years, some persons active in the repeated performance of unloading, testing and reloading of the ICs have been known to suffer painful abrasions, blisters and occasional bleeding of thumbs and fingers. The common solution to these problems is to rotate personnel to distribute exposure to the physically stressful loading chore among the immediate working staff. Also the use of some protective means which will not seriously affect the persons dexterity has been employed. For example, adhesive plastic strips judiciously placed on thumbs and fingers have been found to provide short-term protection.

SUMMARY OF THE INVENTION

It is an object of the invention to provide a simple hand tool for assisting in closure of full IC cartridges and so reduce exposure of the person employed for this purpose, to abrasion and associated medical risk.

A hand tool, for assisting closure of elongated storage containers of a type used for storing integrated circuit (IC) packages end on end tightly against one another between pins residing in orifices defined in the storage container, includes a base having first and second ends. A shank extends substantially normal to the base from the first of said ends and terminates at a grip formation extending substantially normal to the shank, away from the base. A pair of tines extends from the second end of the base substantially normal to the base and along the direction of the shank. In use, to assist closure of an elongated storage cartridge having been filled with IC packages, the tines are inserted in an open end of the cartridge with the shank lying along an outside surface of the cartridge. Thereafter, pressure is manually applied to urge the tines against an IC package to sufficiently displace the ICs, to clear the holes, and to permit insertion of the pin into the holes. Once the pin is inserted, the pressure is released and the IC packages are firmly retained within the storage container.

BRIEF DESCRIPTION OF THE DRAWINGS

An example embodiment is described with reference to the accompanying drawings in which.

DESCRIPTION OF THE EXAMPLE EMBODIMENT

Figure 1:
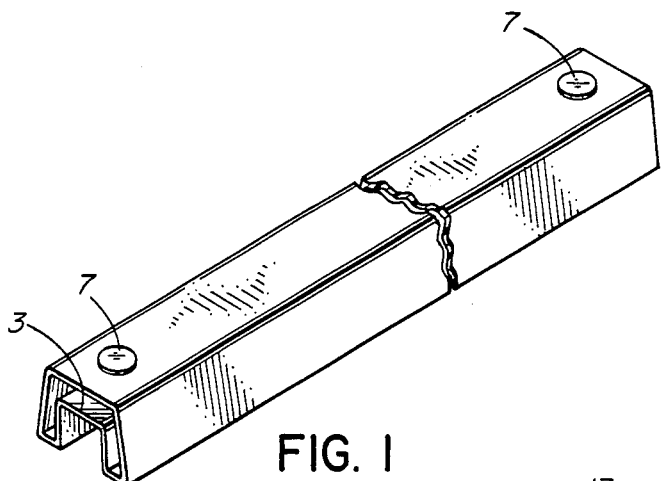
FIG. 1 is a perspective view of an IC package storage cartridge with the closure pins in place.

The IC storage container or cartridge illustrated in FIG. 1, includes outer and inner channels 2 and 3 between which IC packages are stored in a manner very well known to persons in the electronic industry. Heads 7 of closure pins are shown in place at opposite ends of the cartridge.

Figure 2:
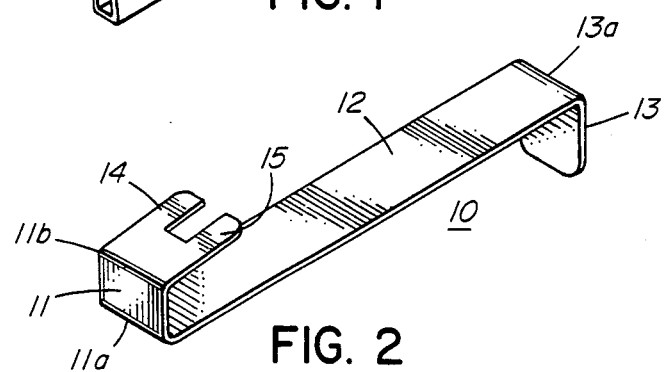
FIG. 2 is a perspective view of a hand tool for assisting enclosure of the storage cartridge in FIG. 1, in accordance with the invention.
Figure 3:
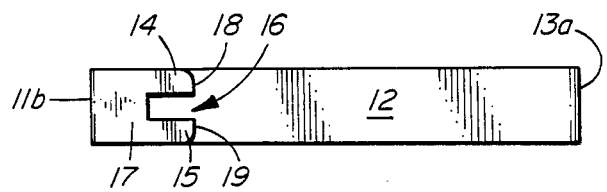
FIG. 3 is a plan view of the hand tool of FIG. 2.
Figure 4:
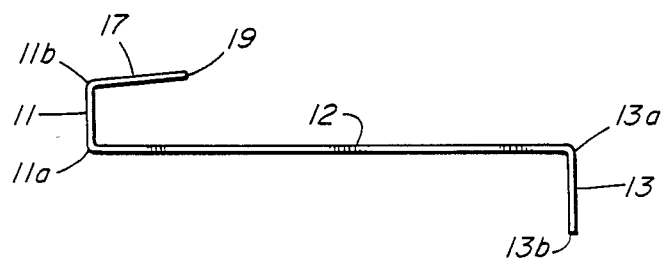
FIG. 4 is a side view of the hand tool in FIG. 2.

The hand tool illustrated in FIGS. 2, 3 and 4 is formed from any convenient stiff material, for example aluminum or stainless steel. It includes an elongated body portion or shank 12 joined with a base 11 extending substantially normal from the shank at one end 11a. A pair of tines 14 and 15 define a channel 16 therebetween and terminate at tip portions 18 and 19. The tines 14 and 15 extend from a portion 17 which extends from a second end 11b of the base 11. The portion 17 is spaced from and lies along the shank 12. A stop formation or grip 13 extends substantially normal from an end of the shank 12 at 13a to a terminating edge 13b.

Figure 5:
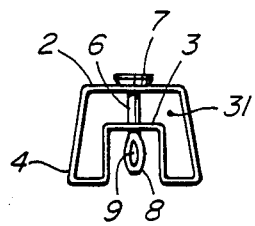
FIG. 5 is an end view of the cartridge of FIG. 1.
Figure 6:
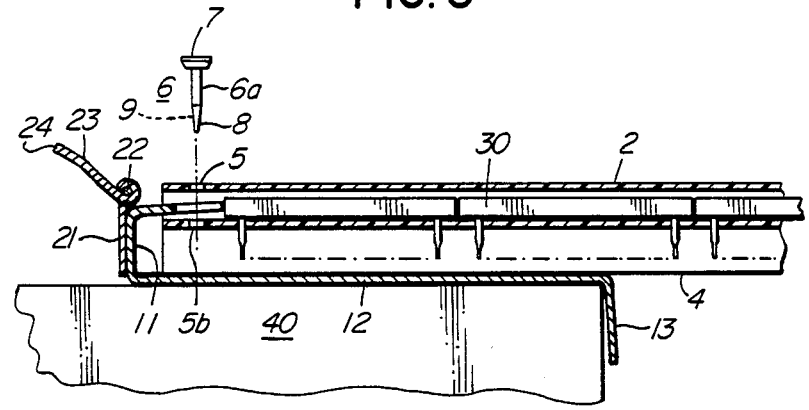
FIG. 6 is a side view of the hand tool being used in combination with the cartridge and also illustrating an additional feature of one example of the hand tool.

The hand tool is particularly adapted to assist in the loading and retaining of ICs within the cartridge illustrated in FIG. 1 and in the end view of same shown in FIG. 5. In FIG. 5, the cartridge is shown to include the outer and inner channels 2 and 3 being joined at 4 to define a cavity 31 for ICs 30, to reside in, as is shown in FIG. 6. Each pin includes a head 7 and a stock 6 between the head 7 and an enlarged tip 8. Each pin is normally inserted into holes 5a and 5b to effect closure of the cartridge. The tip 8 is enlarged laterally and defines an opening 9 which permits the enlarged tip to collapse somewhat such that the pin may be forcibly withdrawn or inserted. However it is such repeated action, manually performed which manifests the previously discussed problem. Assistance obtained from conventional tools such as a flat blade screwdriver or long-nosed pliers is inconsistent and frequently culminates by causing abrasions, on one or more fingers or thumbs.

One method of using the hand tool is to place the shank 12 on a supporting surface 40, such as a table or a bench, with the grip 13 extending downwardly over an edge of the table or bench, as shown in FIG. 6. When one of the pins is inserted at one end of the cartridge, the cartridge is then filled with ICs and a resilient spacer. The remaining unpinned end of the full cartridge is placed over the tines 14 and 15 with the tips pressing against an end of an IC 30. The body of the cartridge is then urged manually, in the direction indicated, to clear the holes 5a and 5b, whereupon the pin is inserted through the holes and the channel 16 between the tines 14 and 15. Thereafter the cartridge is removed from the hand tool and the ICs are thus retained between the pins.

Figure 7:
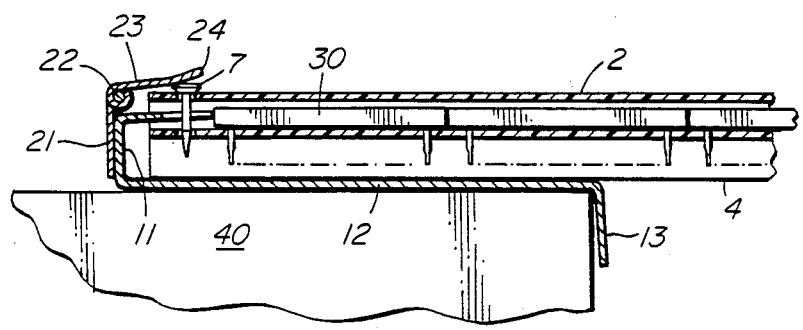
FIG. 7 is similar to FIG. 6 however illustrating the combination of the hand tool and the storage cartridge as closure is completed.

In one variation of the tool as illustrated in FIGS. 6 and 7, a flap 23 is provided to further assist in the manual insertion of the closure pin. A flange 21 of a hinge 22 is fastened to the base 11. The hinge 22 carries the flap 23 which is initially positioned to extend away from the cartridge while the pin is being inserted, as shown in FIG. 6. In this example, the pin is inserted only as far as is convenient without using significant force, as far as the hole 5b for example, whereafter the flap 23 is rotated and pressed downwardly to drive the pin home as is illustrated in FIG. 7. The flap 23 extends to a terminating edge 24 and is of any convenient length and is of sufficient width to distribute the pressure of pin insertion over a wide area of a person's finger or thumb and thereby reduce the liklihood of abrasion and discomfort.

What is claimed is:

1. A hand tool for assisting closure of elongated storage cartridges of a type used for integrated circuit (IC) packages stored end on end and maintained tightly against one another in a space between inserted closure pin means residing in orifices defined in an elongated storage cartridge, the hand tool comprising:
    a base having first and second ends;
    a shank extending substantially normal to the base from one of said ends and terminating at a grip formation extending substantially normal to the shank and away from the base;
    a pair of tines extending from the second end of the base substantially normal to the base spaced from and along the shank, the tines defining a channel therebetween; and
    a hinged flap mounted next to the second end and being rotatable to assume a position spaced parallel with and extending along the tines;
    whereby in use to assist closure of an elongated storage cartridge having been filled with IC packages, the tines are inserted in an open end of the cartridge with the shank lying along an outside surface of the cartridge and thereafter pressure is manually applied to urge the tines against an IC package to sufficiently displace said packages to clear the holes and permit insertion of the pin means into said holes, said flap being so positionable as to assist in driving the pin into an interference fit relationship with said holes, whereafter said pressure is released and said IC packages are firmly retained within the storage cartridge.

2. A hand tool as defined in claim 1 wherein the channel defined by the tines is of a depth extending from tips of the tines to a terminating wall intermediate said tips and the base, and is of a width sufficient to permit clear passage of the pin between the tines and wherein the flap when in said spaced parallel position extends to a terminating edge intermediate the tips of the tines and the terminating wall.

* * * * *